(12) United States Patent
Watanabe et al.

(10) Patent No.: US 6,897,138 B2
(45) Date of Patent: May 24, 2005

(54) METHOD AND APPARATUS FOR PRODUCING GROUP III NITRIDE COMPOUND SEMICONDUCTOR

(75) Inventors: Hiroshi Watanabe, Aichi (JP); Masayoshi Koike, Aichi (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 32 days.

(21) Appl. No.: 10/178,853

(22) Filed: Jun. 25, 2002

(65) Prior Publication Data

US 2002/0197830 A1 Dec. 26, 2002

(30) Foreign Application Priority Data

| Jun. 25, 2001 | (JP) | ................................ 2001-191554 |
| Jun. 26, 2001 | (JP) | ................................ 2001-192614 |
| Jun. 26, 2001 | (JP) | ................................ 2001-192615 |

(51) Int. Cl.[7] ............................................. H01L 21/28
(52) U.S. Cl. ........................................ 438/604; 438/694
(58) Field of Search .......................... 438/459, 488–9, 438/503–4, 494, 507, 604, 694–5, 699, 706

(56) References Cited

U.S. PATENT DOCUMENTS

| 5,679,152 A | * | 10/1997 | Tischler et al. | ............... | 117/97 |
| 5,966,622 A | * | 10/1999 | Levine et al. | ............... | 438/459 |
| 6,335,546 B1 | * | 1/2002 | Tsuda et al. | ............... | 257/94 |

FOREIGN PATENT DOCUMENTS

| JP | 63-239989 | 10/1988 |
| JP | 03-218625 | 9/1991 |
| JP | 05-183189 | 7/1993 |
| JP | 05-198841 | 8/1993 |
| JP | 05-206520 | 8/1993 |
| JP | 07-165498 | 6/1995 |
| JP | 07-202265 | 8/1995 |
| JP | 9-129559 | 5/1997 |
| JP | 09-208396 | 8/1997 |
| JP | 2000-269143 | 9/2000 |
| JP | 2001-043617 | 2/2001 |
| JP | 2001-077475 | 3/2001 |
| JP | 2001-185495 | 7/2001 |
| JP | 2002-261026 | 9/2002 |
| JP | 2003-007621 | 1/2003 |

* cited by examiner

Primary Examiner—Hoai Pham
Assistant Examiner—Ginette Peralta
(74) Attorney, Agent, or Firm—McGinn & Gibb, PLLC

(57) ABSTRACT

The method of the invention for producing a Group III nitride compound semiconductor, employing an etchable substrate which is produced from a material other than the Group III nitride compound semiconductor, includes stacking one or more layers of the Group III nitride compound semiconductor on one face of the substrate and etching the other face of the substrate while stacking one or more semiconductor layers or after completion of stacking one or more semiconductor layers, to thereby reduce the thickness of most of the substrate. The apparatus of present invention for producing a semiconductor through vapor phase growth, contains a substrate for vapor-phase-growing the semiconductor; a source-supplying system for supplying a source for vapor phase growth of the semiconductor; and an etchant-supplying system, wherein the source-supplying system and the etchant-supplying system are isolated through placement of the substrate.

11 Claims, 7 Drawing Sheets

METHOD AND APPARATUS FOR PRODUCING GROUP III NITRIDE COMPOUND SEMICONDUCTOR

The present application claims the Convention priority from Japanese Patent Application Nos. 2001-191554, 2001-192614, and 2001-192615, the complete disclosures of which are hereby incorporated herein by reference.

BACKGROUND OF THE INVENTION

1. Field of the Invention

The present invention relates to a method and an apparatus for producing a Group III nitride compound semiconductor. More particularly, the invention relates to a method for producing a thick-film Group III nitride compound semiconductor or for producing a Group III nitride compound semiconductor having a thickness which allows the semiconductor to be handled as an epitaxial growth substrate.

As used herein, the term "Group III nitride compound semiconductor" refers to a semiconductor having arbitrary compound crystal proportions and represented by $Al_xGa_yIn_{1-x-y}N$ ($0 \leq x \leq 1$; $0 \leq y \leq 1$; $0 \leq x+y \leq 1$), and encompasses 2-component semiconductors such as AlN, GaN, and InN; 3-component semiconductors such as $Al_xGa_{1-x}N$, $Al_xIn_{1-x}N$, and $Ga_xIn_{1-x}N$ (in each case, $0<x<1$); and 4-component semiconductors represented by $Al_xGa_yIn_{1-x-y}N$ ($0<x<1$; $0<y<1$; $0<x+y<1$). The "Group III nitride compound semiconductor" also encompasses semiconductors which contain a Group III element such as boron (B) or thallium (Tl) and in which nitrogen atoms are partially substituted by Group V elements such as phosphorus (P) and arsenic (As). Unless otherwise specified, in the present specification the term "Group III nitride compound semiconductor" also encompasses such semiconductors which are doped with an impurity for determining a conduction type of p or n.

2. Description of the Related Art

When Group III nitride compound semiconductors such as those represented by $Al_xGa_yIn_{1-x-y}N$ ($0 \leq x \leq 1$; $0 \leq y \leq 1$; $0 \leq x+y \leq 1$) are produced through epitaxial growth, a substrate for growth is required. However, Group III nitride compound semiconductor substrates for use in epitaxial growth having a manageable thickness are not commercially available. Therefore, substrates produced from dissimilar materials other than Group III nitride compound semiconductors, such as a sapphire substrate, a silicon carbide (SiC) substrate, and a silicon (Si) substrate, have been employed instead.

However, the dissimilar substrates have lattice constants which differ considerably from those of Group III nitride compound semiconductors. Thus, generally, a so-called buffer layer is grown on the dissimilar substrate in advance, and a Group III nitride compound semiconductor is epitaxially grown on the buffer layer. Even when this approach is employed, large thermal stress is generated by difference in thermal expansion coefficient between the substrate and the Group III nitride compound semiconductor during cooling to room temperature after epitaxial growth conducted at a temperature as high as 1,000° C. or even higher. In other words, even though epitaxial growth can be successfully performed at high temperature, a significant difference in thermal expansion coefficient between the substrate and the Group III nitride compound semiconductor induces a large number of crystal defects and cracks in the substrate and the Group III nitride compound semiconductor during cooling to room temperature.

Specifically, approximate linear expansion coefficients (at about room temperature, along the a-axis) of gallium nitride (GaN), aluminum nitride (AlN), sapphire ($\alpha$-$Al_2O_3$), and silicon (Si) are $5.6 \times 10^{-6}$/K, $4.2 \times 10^{-6}$/K, $7.5 \times 10^{-6}$/K, and $3.6 \times 10^{-6}$/K, respectively. Accordingly, when thick-film GaN is formed on a sapphire ($\alpha$-$Al_2O_3$) substrate or a silicon (Si) substrate, followed by cooling by 1,000 K (or ° C.), a difference in shrinkage as large as 0.2% arises along the a-axis. Particularly when a GaN layer having a thickness of several tens of $\mu$m or more is formed on a sapphire ($\alpha$-$Al_2O_3$) substrate or a silicon (Si) substrate, cracks are inevitably generated in the formed GaN layer and in the sapphire ($\alpha$-$Al_2O_3$) substrate or the silicon (Si) substrate, due to thermal stress during cooling.

From another viewpoint, it has been considered almost essential that production, through epitaxial growth, of a Group III nitride compound semiconductor, particularly gallium nitride (GaN), of an excellent single-crystalline state requires a high temperature of 1,000° C. or higher.

SUMMARY OF THE INVENTION

The present inventors have carried out extensive studies in order to solve the aforementioned problems. Thus, an object of the present invention is to provide a method for producing a Group III compound semiconductor, which method induces no cracks in the Group III nitride compound semiconductor even when the semiconductor is cooled by approximately 1,000° C. or more following epitaxial growth. Another object of the invention is to provide an apparatus for producing the same.

Accordingly, a first invention for solving the aforementioned problems is drawn to a method for producing a Group III nitride compound semiconductor, the method employing an etchable substrate which is produced from a material other than the Group III nitride compound semiconductor (i.e., dissimilar substrate or hetero-substrate), comprising stacking one or more layers of the Group III nitride compound semiconductor on one face of the substrate and etching the other face of the substrate while stacking one or more semiconductor layers or after completion of stacking one or more semiconductor layers, to thereby reduce the thickness of the substrate until most of the substrate has been removed. The present invention also encompasses repetition of stacking one or more Group III nitride compound semiconductor layers on one face of the hetero-substrate and etching the other face of the hetero-substrate.

A second invention is drawn to a method for producing a Group III nitride compound semiconductor, the method employing an etchable substrate which is produced from a material other than the Group III nitride compound semiconductor (i.e., dissimilar substrate or hetero-substrate), comprising placing the substrate such that one face of the substrate is faced to an epitaxial growth system for producing the Group III nitride compound semiconductor and the other face of the substrate is faced to an etching system which is isolated from the epitaxial growth system; stacking one or more layers of the Group III nitride compound semiconductor on one face of the substrate in the epitaxial growth system; and etching the other face of the substrate in the etching system while stacking one or more semiconductor layers or after completion of stacking one or more semiconductor layers, to thereby reduce the thickness of the substrate until most of the substrate has been removed. As used herein, the term "isolated" does not refer to a completely airtight state, but refers to a certain degree of airtightness that does not substantially affect reaction. The present invention also encompasses repetition of stacking one or more Group III nitride compound semiconductor layers on one face of the substrate and etching the other face of the substrate.

A third invention is drawn to a specific embodiment of the method of the second invention, wherein the substrate is a silicon (Si) substrate. A fourth invention is drawn to a specific embodiment of the method of the second or third invention, wherein the etching system employs a gas or gaseous etchant. The term "gaseous" also refers to mist form (spray form). A fifth invention is drawn to a specific embodiment of the method of the second or third invention, wherein the etching system employs hydrogen halide gas as a main component. The term "main component" refers to hydrogen halide gas which may be diluted with a carrier gas which is inert to the corresponding reaction system.

A sixth invention is drawn to a specific embodiment of the method of any one of the second to fourth inventions, wherein, within the etching system, one or more steps are performed, including a growth step comprising at least one step performed by a chloride method including transporting gallium (Ga) or indium (In) to a face of the substrate by use of hydrogen chloride (HCl) gas. The chloride method includes maintaining an element such as gallium (Ga) or indium (In) at high temperature; spraying hydrogen chloride (HCl) gas to the element, to thereby sublimate the chloride thereof; and transporting the chloride to an epitaxial growth substrate.

A seventh invention is drawn to an apparatus for producing a semiconductor through vapor phase growth, comprising a substrate for vapor-phase-growing the semiconductor; a source-supplying system for supplying a source for vapor phase growth of the semiconductor; and an etchant-supplying system, wherein the source-supplying system and the etchant-supplying system are isolated through placement of the substrate, to thereby perform vapor phase growth of the semiconductor on one face of the substrate while etching the other face of the substrate. As used herein, the term "isolated" does not necessarily refer to a completely airtight state, but may refer to a certain degree of airtightness that does not substantially affect reaction. The same similarly applies in an eighth invention.

The eighth invention is drawn to an apparatus for producing a Group III nitride compound semiconductor, comprising a substrate for vapor-phase-growing the Group III nitride compound semiconductor; a source-supplying system for supplying a source for vapor phase growth of the Group III nitride compound semiconductor; and an etchant-supplying system, wherein the source-supplying system and the etchant-supplying system are isolated through placement of the substrate, to thereby perform etching of one face of the substrate, simultaneous with vapor phase growth of one or more layers of the Group III nitride semiconductor on the other face of the substrate or after one or more layers of the Group III nitride semiconductor have been grown.

A ninth invention is drawn to a method for producing a Group III nitride compound semiconductor, comprising securing a substrate having a thickness of 50 $\mu$m or less (preferably 10–20 $\mu$m) by means of a holder such that at least a portion of one face of the substrate is exposed to a reaction system; and epitaxially growing the Group III nitride compound semiconductor on the exposed face of the substrate. The "holder" may be a monolithic-type holder or a holder made of a plurality of separable parts.

A tenth invention is drawn to a method for producing a Group III nitride compound semiconductor, comprising a first securing step for securing a substrate having a thickness of more than 50 $\mu$m in a first holder which can hold, in a partially burying fashion, a lower portion of the substrate that has a predetermined thickness of 50 $\mu$m or less; a thinning step for removing an unburied portion of the substrate, the lower portion being buried and the substrate being secured in the first holder; a release step for releasing the substrate from the first holder; a washing step for washing the first holder and the thinned substrate; a burying step for burying the thinned and washed substrate in the washed first holder; a second securing for securing the first holder and the thinned substrate by means of a second holder, such that the second holder, the first holder, and the thinned substrate are integrated and at least a portion of one face of the thinned substrate is exposed; and a semiconductor growth step for epitaxially growing one or more layers of the Group III nitride compound semiconductor on the exposed surface of the substrate which is held by the first holder and the second holder.

An eleventh invention is drawn to a specific embodiment of the method of the ninth or tenth invention, wherein the semiconductor is epitaxially grown through vapor phase growth. A twelfth invention is drawn to a specific embodiment of the method of the ninth or tenth invention, wherein the semiconductor is epitaxially grown through a chloride method including supplying a Group III element in the form of a chloride thereof.

A thirteenth invention is drawn to a specific embodiment of the method of any one of the ninth to twelfth inventions, wherein the substrate is a silicon (Si) substrate.

A fourteenth invention is drawn to a method for producing a Group III nitride compound semiconductor through epitaxial growth of the Group III nitride compound semiconductor on a substrate, wherein at least a portion of an area of the substrate that is to be in contact with one or more layers of the Group III nitride compound have a thickness of ½ or less the thickness of said one layer of the semiconductor or have a thickness of ½ or less the total thickness of said more layers of the semiconductor.

A fifteenth invention is drawn to a method for producing a Group III nitride compound semiconductor through epitaxial growth of the Group III nitride compound semiconductor on a substrate, the method comprising a thinning step for controlling the thickness of at least a portion of an area of the substrate that is to be in contact with one or more layers of the Group III nitride compound to be ½ or less the thickness of said one layer of the semiconductor or to be ½ or less the total thickness of said more layers of the semiconductor; and an epitaxial growth step for growing one or more layers of the Group III nitride compound semiconductor on the substrate which has been subjected to the thinning step.

A sixteenth invention is drawn to a specific embodiment of the method of fifteenth invention, wherein a desired portion of the substrate is removed through the thinning step. A seventeenth invention is drawn to a specific embodiment of the method of fifteenth invention, wherein the thinning step comprises wet etching an unmasked portion provided after masking of one face and a desired portion of the substrate.

An eighteenth invention is drawn to a specific embodiment of the method of any one of the fourteenth to seventeenth inventions, wherein the substrate is a silicon (Si) substrate.

By etching the backside (i.e., the side opposite the growth side) of a substrate during epitaxial growth of a Group III nitride compound semiconductor by use of the substrate or after completion of growth of the semiconductor, the thickness of the substrate can be reduced to a considerable degree. In the former case in which epitaxial growth and etching are performed simultaneously, the semiconductor is epitaxially grown on a thick substrate at an initial stage, and epitaxially growth can be completed as if the growth were performed by use of a thin substrate. Specifically, even when a thick substrate which is easy to handle is used at initiation of epitaxial growth of the Group III nitride compound semiconductor at high temperature, after completion of epitaxial growth the grown Group III nitride compound semiconductor remains attached to a thin substrate during cooling to room temperature. In the latter case in which etching is performed after completion of epitaxial growth, a similar effect can be attained by initiating etching from a high temperature state after epitaxial growth. According to such a production method, the substrate can be removed substantially completely or completely through etching. When the substrate is substantially thinned through etching, cracks of the Group III nitride compound semiconductor caused by thermal stress can be prevented. When the substrate is removed substantially completely, the Group III nitride compound semiconductor which has been grown at an initial stage on the substrate formally serves as an epitaxial growth substrate on which the semiconductor has been grown. Thus, no thermal stress is generated and no cracks are generated in the Group III nitride semiconductor (features of the first and second inventions).

In connection with the etchable substrate, a silicon (Si) substrate is preferably used, since the substrate is inexpensive and uniform-quality products are readily available (feature of the third invention). An etchant of gas or gaseous form can be readily fed into an etching system (feature of the fourth invention). Particularly, hydrogen halide is easy to handle (feature of the fifth invention).

In the epitaxial growth system, a chloride method including transporting an element such as gallium (Ga) or indium (In) by hydrogen chloride (HCl) gas to a substrate face provides high growth speed and is preferred in formation of $Ga_xIn_{1-x}N$ ($0 \leq x \leq 1$) thick film (feature of the sixth invention).

The apparatus for producing a semiconductor through vapor phase growth wherein the source-supplying system and the etchant-supplying system are substantially isolated through placement of the substrate can effect the production methods described in the first to sixth inventions (feature of the seventh and eighth inventions).

Thermal stress is generated not only in the case of a large difference in thermal expansion coefficient, but also in the case in which both the substrate and the epitaxial growth layer are thick. Therefore, the thickness of a substrate is reduced to 50 $\mu$m or less (preferably 10–20 $\mu$m), and the substrate is secured by means of a holder, and the Group III nitride compound semiconductor is formed on the exposed face of the substrate. When this approach is employed, thermal stress generated during a process of lowering the temperature at growth by approximately 1,000° C. (K) to room temperature can be reduced considerably, even though thick-film Group III nitride compound semiconductor is formed. Thus, crack generation caused by thermal stress at least in the Group III nitride compound semiconductor layer can be suppressed considerably (feature of the ninth invention).

Although such a thin substrate of a thickness of 50 $\mu$m or less is difficult to handle, the feature of the tenth invention makes such handling possible. Specifically, two separate holders are used for forming the Group III nitride compound semiconductor. Among these, a first holder has a groove having a depth of 50 $\mu$m or less, and the height of the face of the first holder (other than the groove) is approximately equal to that of a thin substrate having a thickness of 50 $\mu$m or less when placed in the groove. Into the first holder having such a groove is placed a thick substrate having a shape which permits partial burying in the groove. The placed substrate is partially removed through a technique such as chemical polishing, to thereby form a thin substrate having a desired thickness of 50 $\mu$m or less. During chemical polishing, the substrate cannot be secured mechanically. However, the substrate is washed after polishing, followed by mechanical securing, to thereby provide a substrate which allows epitaxial growth of a Group III nitride compound semiconductor at approximately 1,000° C. (feature of the tenth invention).

By employing vapor phase growth, high-quality Group III nitride compound semiconductors can be produced (feature of the eleventh invention). By employing a chloride method including supplying a Group III element in the form of a halide thereof, epitaxial growth can be performed at a very high speed (feature of the twelfth invention). Inexpensive and thin-layer substrates can be produced readily by employing a silicon (Si) substrate (feature of the thirteenth invention).

Thermal stress is generated not only in the case of a large difference in thermal expansion coefficient, but also in the case in which both the substrate and the epitaxial growth layer are thick. Therefore, a substrate having at least a portion being in contact with the epitaxial growth layer having a thickness ½ or less the epitaxial growth layer is used. Alternatively, the thickness of the desired portion is reduced in advance through a thinning step. By employing these approaches, thermal stress can be reduced considerably. Thus, crack generation caused by thermal stress at least in the Group III nitride compound semiconductor can be suppressed considerably (feature of the fourteenth and fifteenth invention). Specifically, a typical substrate has a uniform thickness of 100 $\mu$m to 1 mm. When gallium nitride (GaN) (thickness: 100 $\mu$m) is formed, a substrate having a thinned portion having a thickness of 50 $\mu$m (½ thickness) or less, preferably 10 $\mu$m (1/10 thickness) or less, more preferably 5 $\mu$m (1/20 thickness) or less, is employed. Alternatively, the thickness of at least a portion of a substrate (e.g. having a uniform thickness of 100 $\mu$m to 1 mm) that is in contact with the epitaxial growth layer is reduced to 50 $\mu$m (½ thickness) or less, preferably 10 $\mu$m (1/10 thickness) or less, more preferably 5 $\mu$m (1/20 thickness) or less.

Thinning of the substrate can be readily performed through etching (feature of the sixteenth invention). Particularly, when one face of the substrate and a desired portion are masked; and the mask is removed after wet etching, the substrate can be readily thinned through such a backside etching while a face of the substrate that is provided for epitaxial growth is maintained intact (feature of the seventeenth invention).

When the substrate is an inexpensive silicon (Si) substrate, a thinned portion can be readily produced. Particularly, the substrate is readily etched through known wet etching techniques, which are readily controllable (feature of the eighteenth invention).

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Embodiments of the present invention will next be described with reference to drawings. However, the present invention is not limited to the following embodiments.

Figure 1:
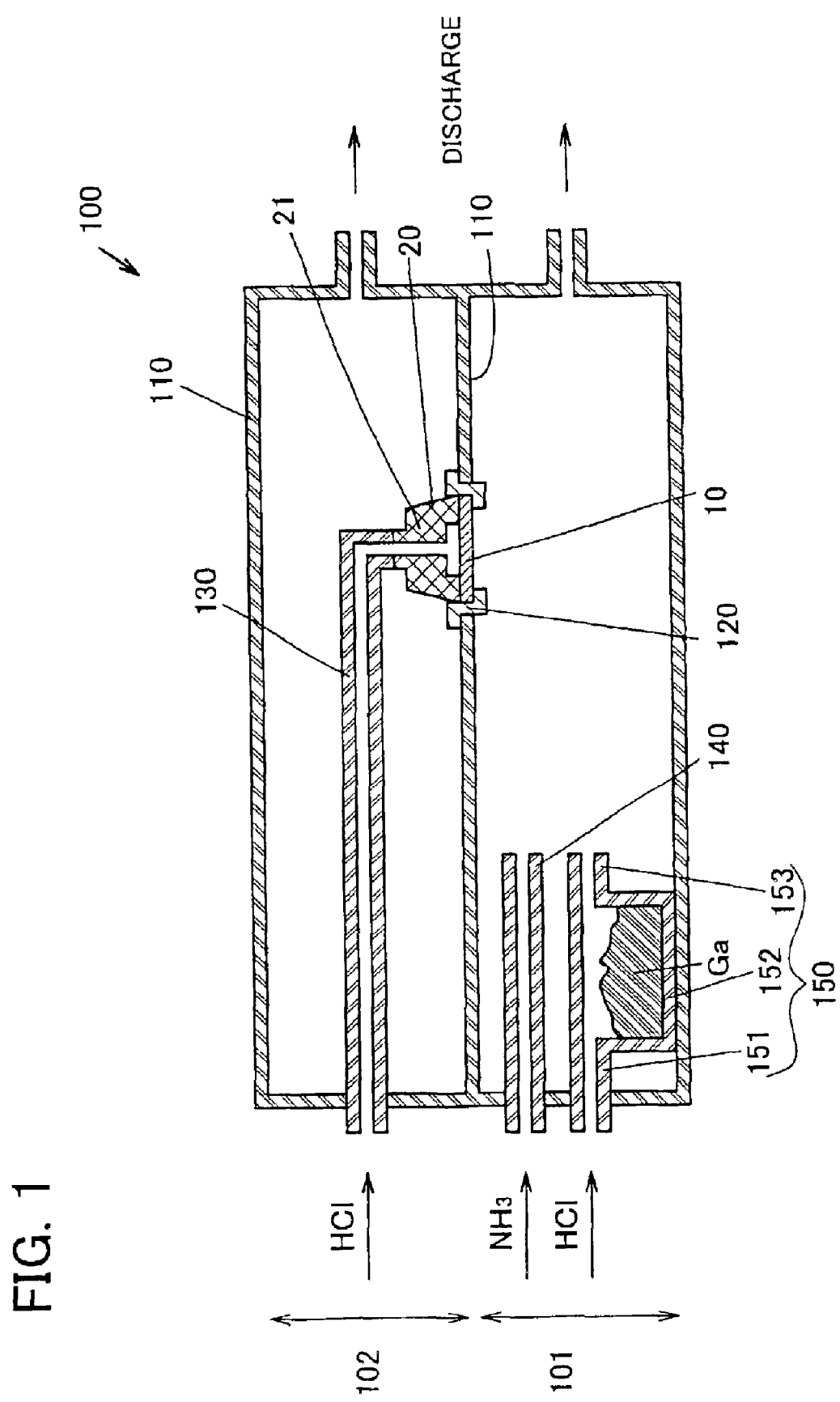
FIG. 1 is a cross-sectional view of the structure of a semiconductor production apparatus according to one specific embodiment of the present invention.
Figure 2:
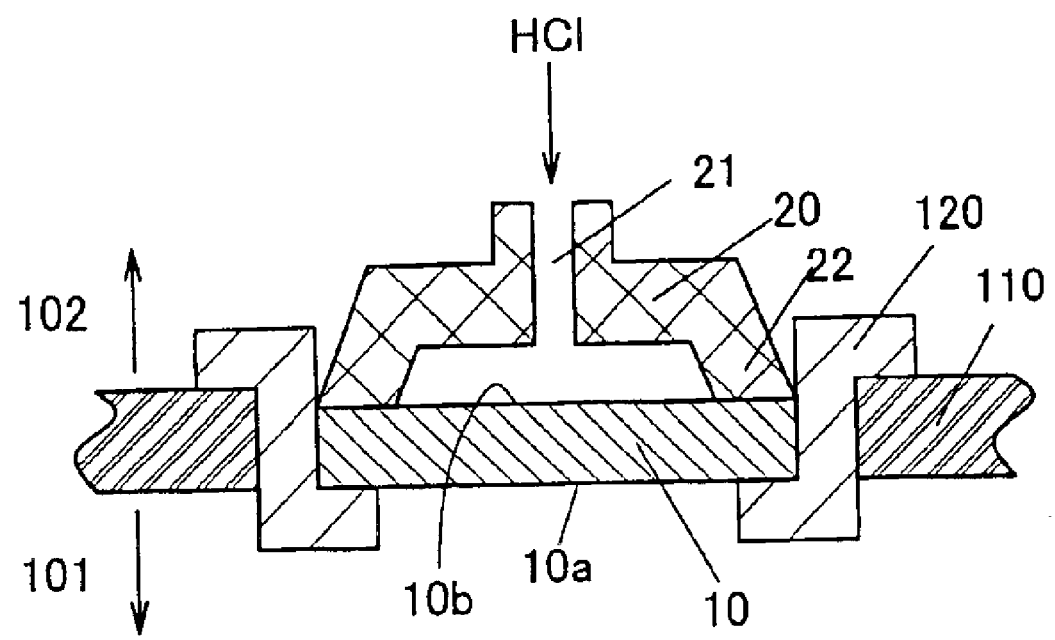
FIG. 2 is a detailed cross-sectional view showing a substrate placement portion in the structure of a semiconductor production apparatus according to one specific embodiment of the present invention.

FIG. 1 is a cross-sectional view of the structure of a semiconductor production apparatus 100 according to one specific embodiment of the present invention. FIG. 1 shows a schematic view of the structure, without showing the presence of joint portions and details thereof. Details of a portion for placing a substrate for performing epitaxial growth are shown in FIG. 2.

In the semiconductor production apparatus 100 shown in FIG. 1, an epitaxial growth system 101 and an etching system 102 are brought into communication with each other before placement of a substrate 10, and are isolated from each other by placement of the substrate 10. A completely airtight state is not required between these two systems. The semiconductor production apparatus 100 comprises a quartz-made reactor 110 having an upper chamber and a lower chamber; a substrate holder 120; an etching gas conduit 130; a Group V element conduit 140; and a Group III element chloride feeder 150. The Group III element chloride feeder 150 comprises a hydrogen chloride conduit 151, a Group III element boat 152, and a Group III element chloride conduit 153.

The epitaxial growth system 101—the lower chamber—has an arrangement of typical VPE. Specifically, metallic gallium or metallic indium is placed in the Group III element boat 152; hydrogen chloride (HCl) is fed from the hydrogen chloride conduit 151; GaCl is fed from the Group III element chloride conduit 153 to the substrate 10; and ammonia is fed from the Group V element conduit 140. These materials may be diluted with a carrier gas so as to be fed through the Group V element conduit 140 or the Group III element chloride feeder 150.

In the etching system 102—the upper chamber—the etching gas conduit 130 is connected to a hole 21 provided in the center of a heat retaining plate 20. FIG. 2 shows details of the etching system 102 in a cross-sectional view. A circular-ring substrate holder 120 having a step is provided in the quartz-made reactor 110 having a circular hole for accommodating a substrate. The substrate 10 is placed from the top in the circular-ring substrate holder 120. The substrate 10 and the circular-ring substrate holder 120 separate the quartz-made reactor 110 into the epitaxial growth system 101 and the etching system 102. The circular-ring substrate holder 120 has a cross-section (radial direction) of Z shape or S shape. The bottom of the holder having a narrow opening sustains the substrate 10, and the peripheral portion of the lower face 10a of the substrate 10 is in contact with the circular-ring substrate holder 120. The top of the circular-ring substrate holder 120, having the largest radius, is suspended by the circular hole for accommodating a substrate provided in the quartz-made reactor 110. Thus, one face (lower face) 10a of the substrate 10 faces the epitaxial growth system 101, whereas the other face (upper face) 10b of the substrate 10 faces the etching system 102. On the upper face 10b of the substrate 10 there is provided a pedestal-shape heat retaining plate 20 having the hole 21 in the center and four legs 22 on the bottom. By virtue of its weight, the heat retaining plate 20 prevents the substrate 10 and the substrate holder 120 from being released from the hole of the quartz-made reactor 110 for accommodating a substrate. In addition, the heat retaining plate 20 stores heat supplied from a heat source outside the quartz-made reactor 110, to thereby maintain the substrate 10 at a desired reaction temperature.

The heat retaining plate 20 is made of carbon and has resistance to etching gas. The etching gas fed from the hole 21 is released onto the upper face 10b of the substrate 10, to thereby etch the upper face 10b of the substrate 10. The gas generated during etching reaction is released via the spaces between the four legs 22 of the heat retaining plate 20 into the etching system 102 in the quartz-made reactor 110, and discharged out to a treatment system.

The general procedure for simultaneously performing etching of the backside of a substrate and epitaxial growth by use of the semiconductor production apparatus 100 will next be described. The feature of simultaneously etching the backside of a silicon (Si) substrate serving as the substrate 10 by use of hydrogen chloride and epitaxially growing gallium nitride (GaN) will next be described with reference to FIG. 3.

Figure 3A:
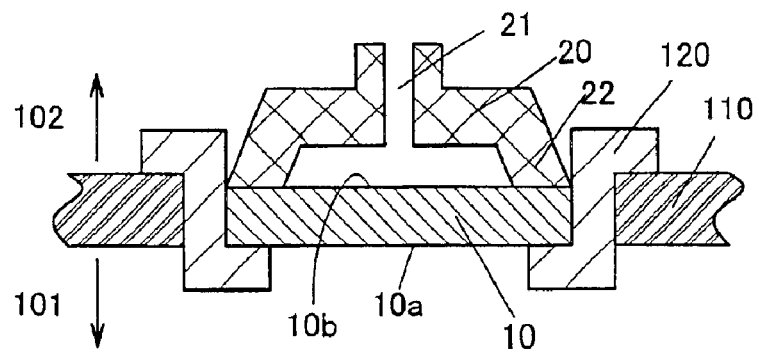
FIGS. 3A to 3D are views showing steps of a method for producing a Group III nitride compound semiconductor according to one specific embodiment of the present invention.
Figure 3B:
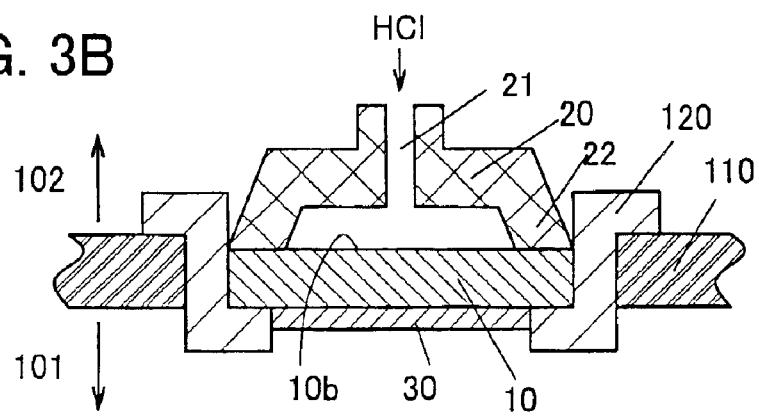
Figure 3C:
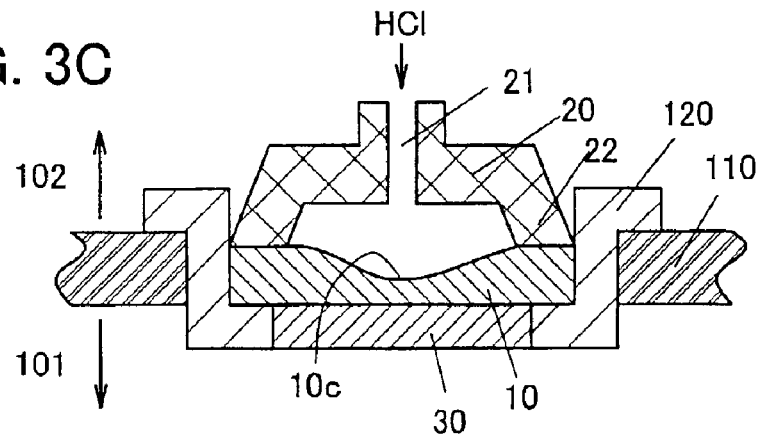
Figure 3D:
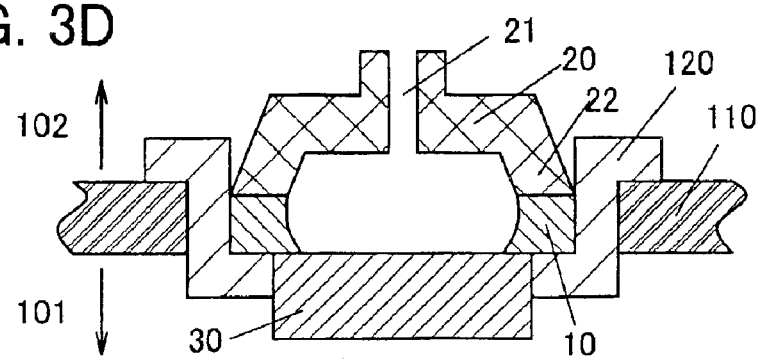
Figure 4A:
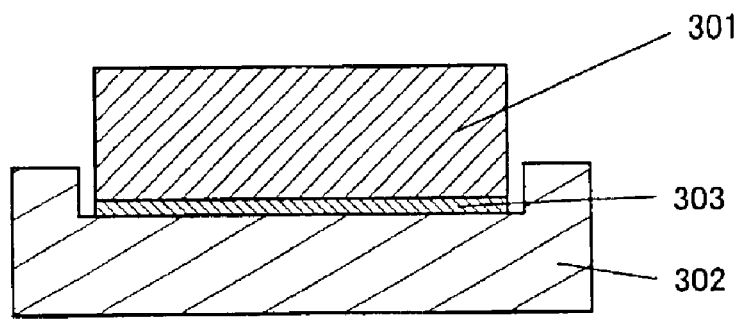
FIGS. 4A to 4D are views showing production steps (layer-thinning steps) of a substrate having a thinned portion according to one specific embodiment of the present invention.
Figure 4B:
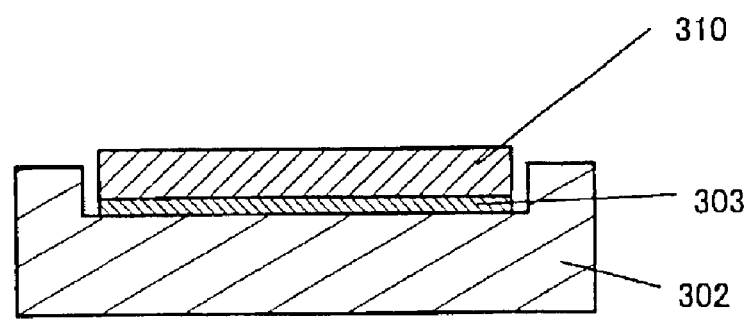
Figure 4C:
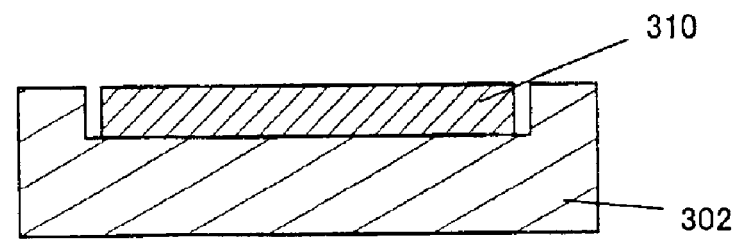
Figure 4D:
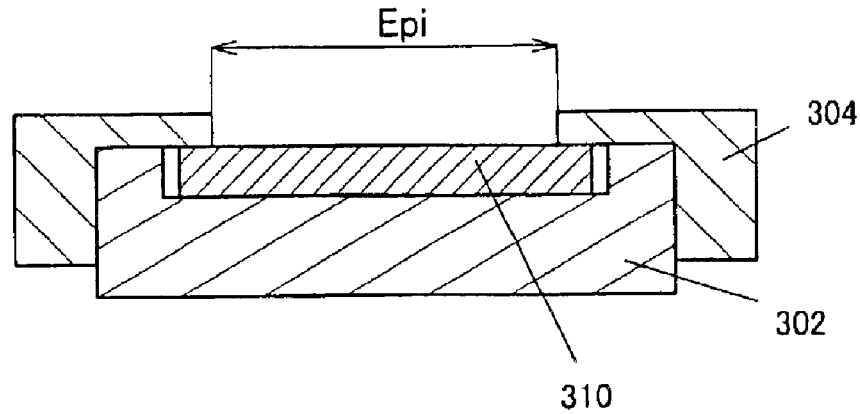

Through heating by means of an external heat source, the silicon (Si) substrate 10 and the heat retaining plate 20 are maintained at 1,000° C. (FIG. 3A). When ammonia ($NH_3$) and gallium chloride (GaCl) are supplied to the epitaxial growth system 101, epitaxial growth of gallium nitride (GaN) 30 on the face 10a of the silicon (Si) substrate 10 is initiated (FIG. 3B). Then, hydrogen chloride (HCl) is supplied through the hole 21 of the heat retaining plate 20 and reacts with silicon at the face 10b of the silicon (Si) substrate 10, to thereby form chlorosilanes (e.g., $H_xSiCl_{4-x}$, $H_xSi_2Cl_{6-x}$) and hydrogen ($H_2$). These gases are discharged via the spaces between the four legs 22 of the heat retaining plate 20 into the etching system 102, and further discharged to a discharge gas treatment system (not illustrated) provided outside the quartz-made reactor 110. In this way, the side of the silicon (Si) substrate 10 facing the etching system 102 is etched, and the silicon (Si) substrate 10 is reduced in thickness in the center portion 10c (FIG. 3C). By continuing epitaxial growth and etching for a desired period of time, portions of the silicon (Si) substrate 10 other than portions in contact with the four legs 22 of the heat retaining plate 20 are almost completely thinned through etching, or are completely removed, to thereby develop the backside of the, gallium nitride (GaN) 30 (FIG. 3D).

Although in the present embodiment the reactor is made of quartz, the present invention is applicable to production apparatus made of arbitrary material. In the above embodiment, an epitaxial growth procedure realized through halide VPE has been described. However, the method of expitaxial growth is selected arbitrarily. Other than the silicon (Si) substrate, the present invention is applicable to any etchable substrates. In this case, any etching gases can be used in accordance with material of the substrate and production apparatus employed or other factors.

Another embodiment of the invention will next be described.

FIG. 4 shows production steps (layer-thinning steps) of a substrate having a thinned portion. A generally disk-shaped silicon (Si) substrate 301 having a diameter of 2.5–5 cm (1–2 inches) and a thickness of 100 $\mu$m to 300 $\mu$m and a first holder 302 made of sapphire and including a groove having a depth of 5–50 $\mu$m for accommodating the substrate are provided. A thin-film adhesive layer 303 is formed on the groove (depth: 5–50 $\mu$m) of the sapphire-made first holder 302, and the silicon (Si) substrate 301 having a thickness of 100 $\mu$m to 300 $\mu$m is bonded thereon (FIG. 4A). In this state, chemical polishing is carried out. While the thickness of the thin-film adhesive layer 303 is taken into account, the silicon (Si) substrate 301 is thinned through chemical polishing such that the thickness of the substrate is made equal to the depth of the groove of the sapphire-made first holder 302. By removing the thin-film adhesive layer 303 by use of an organic solvent or a similar agent, the thinned substrate (silicon (Si) substrate) 310 whose thickness is made equal to the depth of the groove of the sapphire-made first holder 302 (FIG. 4B) is placed directly on the groove of the sapphire-made first holder 302 (FIG. 4C). Subsequently, a second circular-ring holder 304 made of quartz and having a hole in the center is assembled with the sapphire-made first holder 302 and the thinned silicon (Si) substrate 310. Through the above integration process, the upper face (other than the groove) of the sapphire-made first holder 302 and the periphery of the thinned silicon (Si) substrate 310 are covered with the quartz-made second holder 304, and the thinned silicon (Si) substrate 310 is held by the sapphire-made first holder 302 and the quartz-made second holder 304. Since one face of the thus-held thinned silicon (Si) substrate 310 is developed partially by the center hole of the quartz-made second holder 304, a Group III element can be supplied to the developed face (represented by "Epi" in FIG. 4D) through a halide transportation method (chloride method), thereby performing epitaxial growth (FIG. 4D).

Although in the above embodiment a silicon (Si) substrate is employed as the substrate, the substrate of the present invention is not limited to a silicon (Si) substrate, and the method of the invention can be applied to any substrate, so long as at least a portion of the substrate can be thinned. The thickness of the substrate is adjusted to 50 $\mu$m or less, preferably approximately 10–20 $\mu$m. The thickness of the epitaxial growth layer of a Group III nitride compound semiconductor formed on the substrate is adjusted to 50 $\mu$m or more, preferably approximately 100–200 $\mu$m. This is because, when an epitaxial growth layer having a thickness not less than that of the substrate is formed, mechanical and thermal characteristics of the epitaxial growth layer predominate over characteristics of the substrate, thereby relaxing strain (e.g., warpage) of the epitaxial growth layer and preventing generation of cracks in the epitaxial growth layer. Although in the above embodiment thinning is carried out through chemical polishing, no particular limitation is imposed on the thinning method, and any thinning method, such as physical-mechanical polishing, or thinning by any chemical reaction, can be employed in accordance with the material of the substrate. In the above embodiment, the holder employed in the thinning step also serves as the holder for use in epitaxial growth. However, these two holders may be different from each other.

In the above embodiment, the thinned substrate is secured by the first and second holders for carrying out epitaxial growth. However, the holder for use in epitaxial growth may be a monolithic type. The material of the holder may be selected arbitrarily so long as the material does not affect the desired reaction or operation in each step.

Still another embodiment of the present invention will next be described.

Figure 5A:
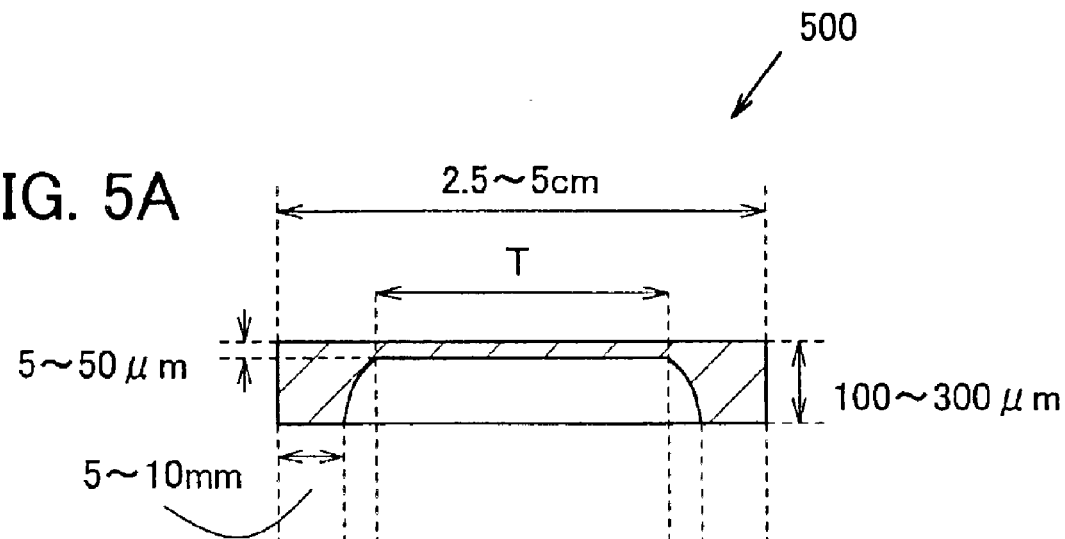
FIG. 5A is a cross-sectional view showing the structure of a substrate having a thinned portion according to one specific embodiment of the present invention.
Figure 5B:
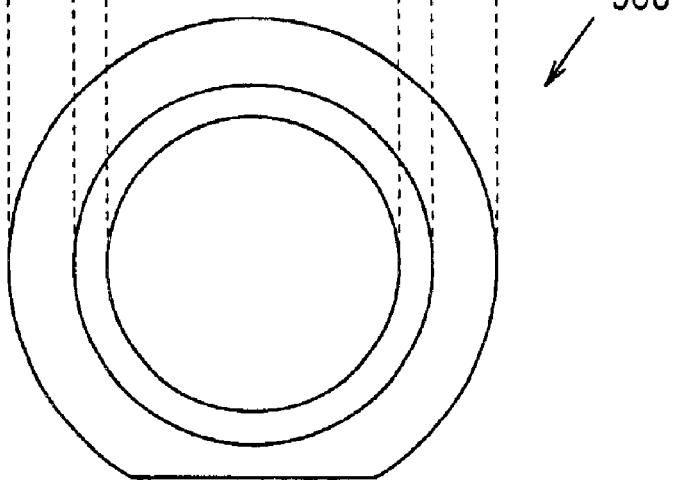
FIG. 5B is a backside view showing the same.

FIG. 5A is a cross-sectional view showing the structure of a substrate 500 having a thinned portion T according to the following specific embodiment of the present invention, and FIG. 5B is a backside view showing the same. The substrate 500 having a thinned portion T is a generally disk-shape substrate having a diameter of 2.5–5 cm and a thickness of 100–300 $\mu$m, and the thinned portion T, having a thickness of 5–50 $\mu$m, is provided in the center of the substrate. The disk-shape substrate has a thick rim portion (periphery) having a thickness of 100–300 $\mu$m and a width of 5–10 $\mu$m.

FIGS. 6A to 6D are views showing production steps (thinning steps) of a substrate 500 having a thinned portion T shown in FIG. 5. While a silicon (Si) substrate is taken as an example, the substrate production steps will next be described.

Figure 6A:
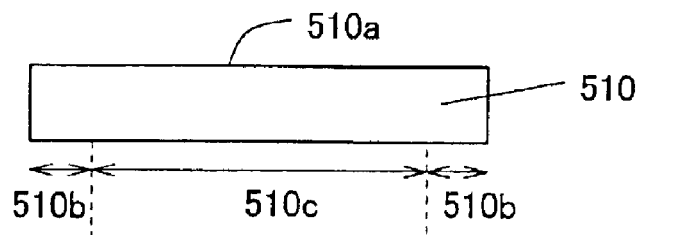
FIGS. 6A to 6D are views showing production steps (layer-thinning steps) of a substrate having a thinned portion according to one specific embodiment of the present invention.
Figure 6B:
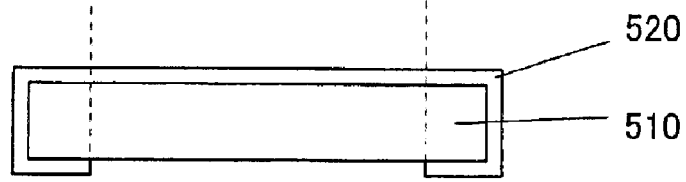
Figure 6C:
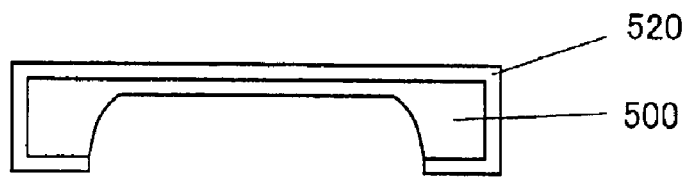
Figure 6D:
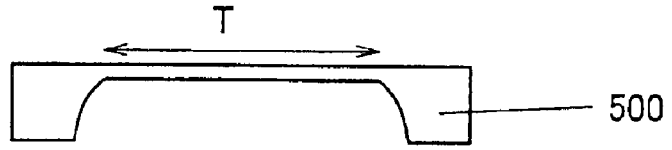

A generally disk-shape silicon (Si) substrate 510 having a thickness of 100–300 $\mu$m is provided (FIG. 6A). The upper face 510a and the rim (periphery) 510b (other than a portion 510c of the lower face to be etched) are covered with a resist 520 (FIG. 6B). The portion 510c of the lower face not covered with the resist 520 is wet-etched by use of a fluoric acid buffer (FIG. 6C). After completion of etching, the silicon (Si) substrate 500 provided, in the center, with a thinned portion T having a thickness of 5–50 $\mu$m can be formed by removing the resist 520 (FIG. 6D).

Figure 6E:
FIGS. 6E to 6G are cross-sectional views showing states of the thinned substrate which has been further subjected to epitaxial growth of a Group III nitride compound semiconductor and a similar treatment.

When a desired Group III nitride compound semiconductor 530 such as GaN is formed on a substrate such as the silicon (Si) substrate 500 having a thinned portion T, no cracks are generated in the Group III nitride compound semiconductor 530 formed on the thinned portion T during a process of lowering the epitaxial growth temperature by approximately 1,000° C. (K) to room temperature. Thus, a thick-film Group III nitride compound semiconductor crystal having a thickness of 100 $\mu$m to some mm can be produced without generating cracks (FIG. 6E).

Figure 6F:
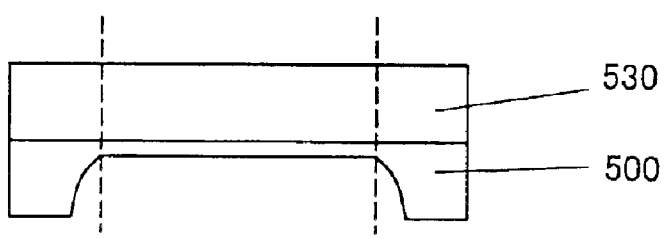
Figure 6G:
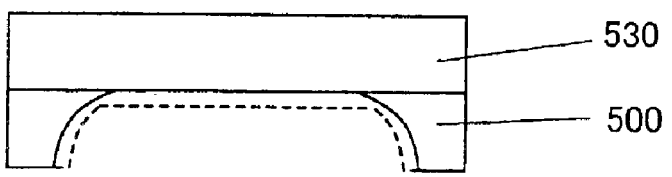

The Group III nitride compound semiconductor 530 formed on the silicon (Si) substrate 500 having a thinned portion T (FIG. 6E) may be separated by dicing, to thereby remove exclusively a portion formed on the thinned potion T (FIG. 6F); i.e., to form a thick-film Group III nitride compound semiconductor crystal 530 having a silicon (Si) thin film on the back face. Alternatively, the thinned portion T may optionally be etched, to thereby remove silicon (Si) 500 of the etched portion, or silicon (Si) 500 of the back side of the Group III nitride compound semiconductor crystal 530 may be completely removed (FIG. 6G). Upon etching, through employment of an appropriately assembled apparatus, the backside silicon (Si) 500 may be etched while a thick Group III nitride compound semiconductor 530 is grown epitaxially.

Figure 7A:
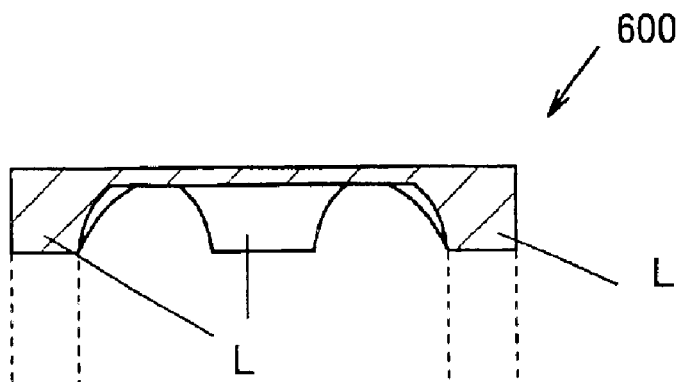
FIG. 7A is a cross-sectional view showing the structure of a substrate having a thinned portion according to one variant embodiment of the present invention.
Figure 7B:
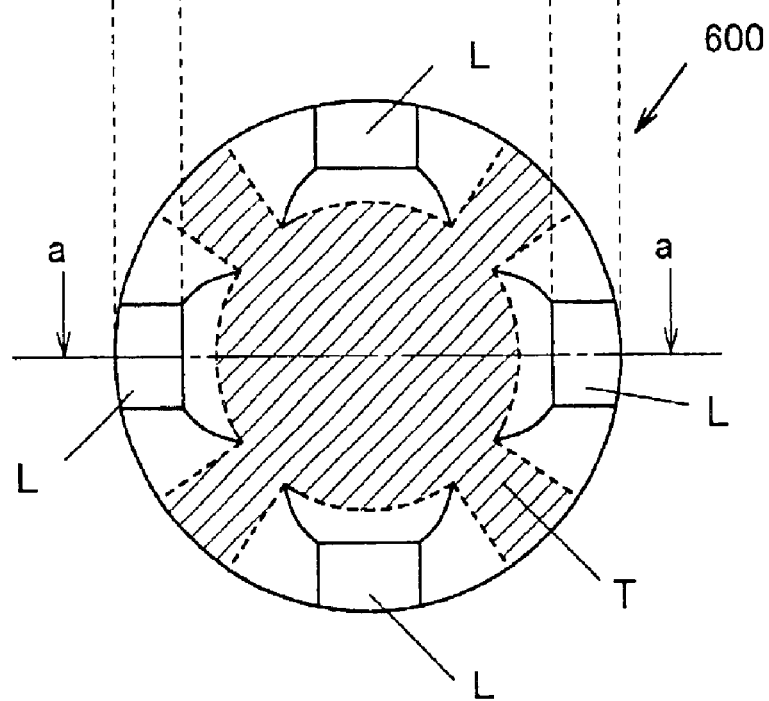
FIG. 7B is a backside view showing the same.

The thick portion of the substrate 500 is not necessarily a continuous rim as shown in FIG. 5, and the substrate 600 may have legs L as shown in FIG. 7A (cross-sectional view) and FIG. 7B (backside view). Although a thick portion having four legs is shown in FIGS. 7A and 7B, the number of the legs L of the substrate 600 is determined arbitrarily. The hatched portion shown in FIG. 7A denotes a cross-section, whereas the hatched portion shown in FIG. 7B denotes a region corresponding to the thinned portion T and does not denote a cross-section.

In FIGS. 5 and 7, substrates 500 and 600 having a thinned portion of approximately uniform thickness are shown. However, the thinned portion is not limited to uniform thickness, and the thickness may be modified arbitrarily, so long as the thickness does not cause thermal-stress-induced cracks in a thick Group III nitride compound semiconductor formed on the corresponding thinned portion. Furthermore, a slightly thick portion may be provided in the form of stripes, a checkerboard pattern, a cross, etc. in order to enhance mechanical strength of the thinned portion. In FIGS. 5 and 7, generally disk-shape silicon substrates are shown as typically employed silicon substrates. However, the shape of the substrate to be thinned is not limited to a circular shape, and any shapes are acceptable so long as a substrate of uniform thickness is employed for thinning.

In the above embodiment, a silicon (Si) substrate is employed as the substrate. However, the present invention is also applicable to any thinnable substrate other than the silicon (Si) substrate. Also, thinning is carried out through etching. However, no particular limitation is imposed on the thinning method, and any thinning method, such as physical-mechanical polishing or thinning by any chemical reaction, can be employed in accordance with the material of the substrate.

The present invention has been described in detail with reference to the above embodiments serving as most practical and appropriate examples. However, the present invention is not limited to these embodiments, and appropriate modifications and applications can be made without deviating from the scope of the present invention.

What is claimed is:

1. A method for producing a Group III nitride compound semiconductor, the method employing a substrate which is produced from a material other than the Group III nitride compound semiconductor, comprising:

placing said substrate such that a lower face of said substrate is faced to an epitaxial growth system for producing the Group III nitride compound semiconductor and an upper face of said substrate is faced to an etching system which is isolated from the epitaxial growth system and is placed at an upper side of said epitaxial growth system;

stacking at least one layer of the Group III nitride compound semiconductor on said lower face of said substrate in the epitaxial growth system; and etching said upper face of said substrate in the etching system at least one of during said stacking at least one semiconductor layer and after completion of said stacking at least one semiconductor layer, to thereby reduce a thickness of said substrate until most of said substrate has been removed.

2. A method for producing a Group III nitride compound semiconductor, according to claim 1, wherein said etching is performed such that a center portion of said substrate is reduced thinner than other portions.

3. A method for producing a Group III nitride compound semiconductor according to claim 1, wherein said substrate comprises a silicon (Si) substrate.

4. A method for producing a Group III nitride compound semiconductor according to claim 3, wherein the etching system employs at least one of a gas and a gaseous etchant.

5. A method for producing a Group III nitride compound semiconductor according to claim 4, wherein, within the etching system, at least one step is performed, including a growth step comprising at least one step performed by a chloride method including transporting gallium (Ga) or indium (In) to a face of said substrate by use of hydrogen chloride (HCl) gas.

6. A method for producing a Group III nitride compound semiconductor according to claim 3, wherein the etching system employs hydrogen halide gas as a main component.

7. A method for producing a Group III nitride compound semiconductor according to claim 3, wherein, within the etching system, at least one step is performed, including a growth step comprising at least one step performed by a chloride method including transporting gallium (Ga) or indium (In) to a face of said substrate by use of hydrogen chloride (HCl) gas.

8. A method for producing a Group III nitride compound semiconductor according to claim 1, wherein the etching system employs at least one of a gas and a gaseous etchant.

9. A method for producing a Group III nitride compound semiconductor according to claim 8, wherein, within the etching system, at least one step is performed, including a growth step comprising at least one step performed by a chloride method including transporting gallium (Ga) or indium (In) to a face of said substrate by use of hydrogen chloride (HCl) gas.

10. A method for producing a Group III nitride compound semiconductor according to claim 1, wherein the etching system employs hydrogen halide gas as a main component.

11. A method for producing a Group III nitride compound semiconductor according to claim 1, wherein, within the etching system, at least one step is performed, including a growth step comprising at least one step performed by a chloride method including transporting gallium (Ga) or indium (In) to a face of said substrate by use of hydrogen chloride (HCl) gas.

* * * * *